United States Patent
Sirbu et al.

(10) Patent No.: US 10,461,507 B1
(45) Date of Patent: Oct. 29, 2019

(54) SUBSTRATE EMITTING VERTICAL-CAVITY SURFACE-EMITTING LASER

(71) Applicant: Mellanox Technologies, Ltd., Yokneam (IL)

(72) Inventors: Alexei Sirbu, Cugy (CH); Vladimir Iakovlev, Yokneam (CH); Yuri Berk, Kiryat Tivon (IL); Elad Mentovich, Tel Aviv (IL)

(73) Assignee: Mellanox Technologies, Ltd., Yokneam (IL)

( * ) Notice: Subject to any disclaimer, the term of this patent is extended or adjusted under 35 U.S.C. 154(b) by 0 days.

(21) Appl. No.: 15/944,955

(22) Filed: Apr. 4, 2018

(51) Int. Cl.
*H01S 5/42* (2006.01)
*H01S 5/183* (2006.01)
(Continued)

(52) U.S. Cl.
CPC .............. *H01S 5/423* (2013.01); *H01S 5/028* (2013.01); *H01S 5/0224* (2013.01); *H01S 5/02248* (2013.01); *H01S 5/02284* (2013.01); *H01S 5/02288* (2013.01); *H01S 5/02292* (2013.01); *H01S 5/0421* (2013.01); *H01S 5/0425* (2013.01); *H01S 5/187* (2013.01); *H01S 5/18305* (2013.01); *H01S 5/18308* (2013.01); *H01S 5/18355* (2013.01); *H01S 5/18375* (2013.01); *H01S 5/18377* (2013.01); *H01S 5/34306* (2013.01); *H01S 5/4087* (2013.01); *H01S 2301/14* (2013.01)

(58) Field of Classification Search
CPC .... H01S 2301/14; H01S 5/18377; H01S 5/42; H01S 5/022; H01S 5/40; H01S 5/183

USPC .................................................. 372/9, 50.124
See application file for complete search history.

(56) References Cited

U.S. PATENT DOCUMENTS

| 7,564,887 B2 * | 7/2009 | Wang | H01S 5/18327 |
| | | | 372/50.11 |
| 2003/0134448 A1 * | 7/2003 | Ju | H01S 5/18308 |
| | | | 438/47 |
| 2006/0285566 A1 * | 12/2006 | Ueki | B82Y 20/00 |
| | | | 372/45.01 |

OTHER PUBLICATIONS

Haglund, A., et al., "Single Fundamental-Mode Output Power Exceeding 6 mW from VCSELs with a Shallow Surface Relief", IEEE Photonics Technology Lett, vol. 16, No. 2, p. 368-370, Feb. 2004.

(Continued)

*Primary Examiner* — Tuan N Nguyen
(74) *Attorney, Agent, or Firm* — Alston & Bird LLP

(57) ABSTRACT

A vertical-cavity surface-emitting laser (VCSEL), substrate emitting VCSEL, and multi-beam emitting device and corresponding manufacturing processes are provided. An example VCSEL comprises a substrate having a first surface and a second surface; an output coupling mirror disposed on the second surface of the substrate; a high reflectivity mirror; and an active cavity material structure disposed between the output coupling mirror and the high reflectivity mirror. The active cavity material structure comprises a first current-spreading layer, a second current-spreading layer, an active region disposed between the first current-spreading layer and the second current-spreading layer, and a tunnel junction overgrown by the second current spreading layer, wherein the tunnel junction is disposed adjacent the active region. The VCSEL is configured to emit radiation outward through the first surface of the substrate.

19 Claims, 9 Drawing Sheets

(51) Int. Cl.
    *H01S 5/187*     (2006.01)
    *H01S 5/042*     (2006.01)
    *H01S 5/022*     (2006.01)
    *H01S 5/028*     (2006.01)
    *H01S 5/40*     (2006.01)
    *H01S 5/343*     (2006.01)

(56) References Cited

OTHER PUBLICATIONS

Macleod, H. A., "Thin-Film Optical Filters", Third Edition, Institute of Physics Publishing, 2001.

O'Brien, T., "Mode Behavior of VCSELs with Impurity-Induced Disordering", IEEE Photonics Technol. Lett., v. 29, No. 14, p. 1179-1182, 2017.

Rantamaki, A., et al., "Thermal management in Long-Wavelength Flip-Chip Semiconductor Disk Lasers", IEEE Journal of Selected Topics in Quantum Electronics, vol. 21, No. 6, p. 336-342, Jul. 2015.

Sirbu, A, et al., "Reliability of 1310 nm Wafer Fused VCSELs", IEEE Photonics Technology Letters, vol. 25, (16), pp. 1555-1558, Aug. 2013.

Sirbu, A., et al., "Wafer-Fused Heterostructures: Application to Vertical Cavity Surface-Emitting Lasers Emitting in the 1310 nm Band", Semicond. Sci. Technol. 26, 014016, 6 pages, 2011.

\* cited by examiner

FIG. 9A
FIG. 9B
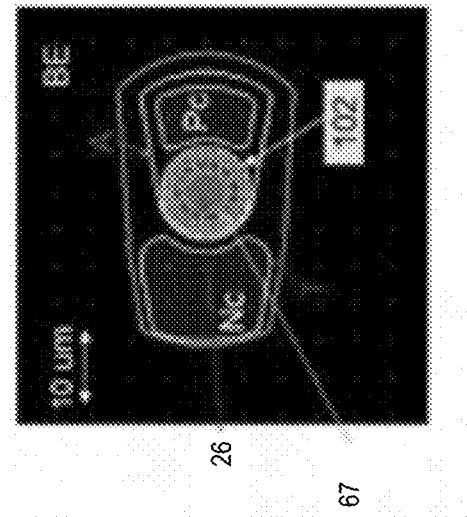
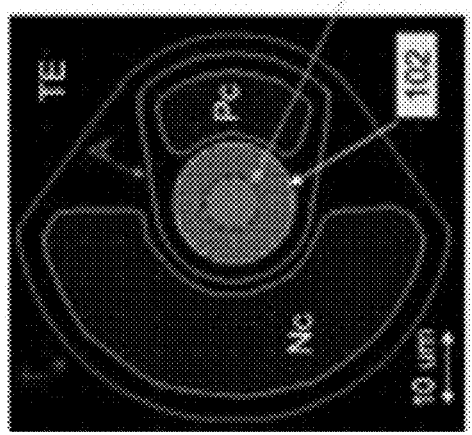
FIG. 9C
| Design | Area (μm²) | | | |
|---|---|---|---|---|
| | Active Region (A) | Pc | Nc | T |
| Top Emitting (TE) | 600 | 170 | 800 | 2100 |
| Bottom Emitting (BE) | 300 | 90 | 200 | 800 |
FIG. 9D
| Top Emitting Design | |
|---|---|
| Nt | 21 |
| Nb | 35 |
| xt | 90% |
| xb | 95% |
| Oct | 82% |
| Ocb | 18% |
| THG | 660 cm⁻¹ |
FIG. 9E
| Bottom Emitting Design | |
|---|---|
| Nb | THG, cm⁻¹ |
| 20 | 1250 |
| 21 | 990 |
| 22 | 830 |
| 23 | 721 |
| 24 | 640 |
| 25 | 580 |

SUBSTRATE EMITTING VERTICAL-CAVITY SURFACE-EMITTING LASER

FIELD

Embodiments of the present invention relate generally to a single mode vertical-cavity surface-emitting laser (VCSEL) with Indium phosphide (InP) based active region in which an emission aperture is defined by an overgrown tunnel junction. Example embodiments relate generally to VCSELs that are configured to be flip chip mounted to a circuit board. Example embodiments relate also to multi-beam emission devices comprising a monolithic VCSEL array.

BACKGROUND

As data communication demands increase in both volume and speed, fiber optics have become an increasingly popular communication approach. One emerging element of this approach for generating the data stream communicated through fiber optics cables comprises a VCSEL optically coupled with a single mode fiber. However, standard top emitting VCSELs generally require wire bonding for electrical connection to the laser driver. These wire bonds may introduce parasitic inductance and reduce the modulation speed. In addition, wire bonds can make assembling external optical elements like lenses for laser beam collimation difficult. The wire bonds may also make coupling the VCSEL emission to single mode fibers and waveguides difficult. Another disadvantage of existing VCSEL designs is that the mechanism for suppression of lateral modes and selection of the fundamental mode that is provided by lateral index variation in the overgrown tunnel junction is quite weak, especially at high driving currents. Yet, operation at high driving currents is highly desirable in order to get increased output power and maximize modulation bandwidth.

BRIEF SUMMARY OF SOME EXAMPLE EMBODIMENTS

Example embodiments of the present invention provide substrate emitting VCSELs, board-mounted VCSELs, multi-beam emitting devices comprising VCSEL arrays, methods for manufacturing such VCSELs, board-mounted VCSELs, and multi-beam emitting devices, and/or the like. Such VCSELs, board-mounted VCSELs, and multi-beam emitting devices may be used in a variety of applications, such as, for example, fiber optic data transmission in high-speed single mode fiber optic communication systems. In various embodiments, a VCSEL comprises an emission structure mounted and/or formed on a substrate. In an example embodiment, the emission structure of the VCSEL comprises an output coupling mirror, a high reflectivity mirror, and an active cavity material structure positioned between the output coupling mirror and the high reflectivity mirror. In various embodiments, the active cavity material structure comprises a top current-spreading layer, a bottom current-spreading layer, an active region disposed between the top current-spreading layer and the bottom current-spreading layer, and a tunnel junction overgrown by the top current spreading layer, with the tunnel junction disposed adjacent to the active region. The VCSEL is configured to emit laser light through the substrate. In an example embodiment, the laser light is electromagnetic radiation of a characteristic wavelength. Thus, the VCSEL may be "flip chip" mounted to a circuit board such as, for example, a printed circuit board.

In various embodiments, the high reflectivity mirror is a composite mirror composed of a partial semiconductor distributed Bragg reflector in combination with a metal reflector. The use of the high reflectivity mirror causes the height of the emission structure in a direction parallel to the emission axis of the VCSEL to be reduced compared to traditional VCSELs. In an example embodiment, this reduced height of the emission structure enables increased modulation speed due to reduced parasitic capacitance of the VCSEL. Additionally, in various embodiments, the high reflectivity mirror may be used to perform mode and/or polarization selection for the VCSEL. For example, in various embodiments, the size and shape of the metal reflector of the high reflectivity mirror may be used to control the mode and/or polarization of the radiation emitted from the VCSEL.

In various embodiments, the light emitted by the VCSEL is characterized by a wavelength in the range comprising a lower wavelength boundary of 1200 nanometers (nm) and an upper wavelength boundary of 1900 nm. For example, the radiation emitted by the VCSEL may be characterized by a wavelength of approximately 1310 nm, in an example embodiment. In some examples, the emitted laser light is configured to transmit data at data transmission rate greater than 25 gigabits per second. Example embodiments enable reaching and/or surpassing 50 Gb/s using non-return-to-zero (NRZ) modulation and 100 Gb/s using four level pulse-amplitude-modulation (PAM-4) on the transmitter optical sub-assembly (TOSA) level.

In a first aspect, a vertical-cavity surface-emitting laser (VCSEL) is provided. In an example embodiment, the VCSEL comprises a substrate having a first surface and a second surface; an output coupling mirror disposed on the second surface of the substrate; a high reflectivity mirror; and an active cavity material structure disposed between the output coupling mirror and the high reflectivity mirror. The active cavity material structure comprises a first current-spreading layer, a second current-spreading layer, an active region disposed between the first current-spreading layer and the second current-spreading layer, and a tunnel junction overgrown by the second current spreading layer, wherein the tunnel junction is disposed adjacent the active region. The VCSEL is configured to emit light outward through the first surface of the substrate.

In an example embodiment, the high reflectivity mirror is a composite mirror comprising a partial semiconductor distributed Bragg reflector mirror and a metal reflector. In an example embodiment, the partial distributed Bragg reflector comprises ten pairs of layers of GaAs and AlGaAs. In an example embodiment, the thickness of a layer of the distributed Bragg reflector equals one-fourth of $\lambda/n$, where $\lambda$ is a wavelength characteristic of the emitted radiation and $n$ is the refractive index of a semiconductor corresponding to the layer. In an example embodiment, the VCSEL defines an emission axis; the tunnel junction defines a tunnel junction diameter in a first plane that is perpendicular to the emission axis; the metal reflector defines a metal reflector diameter in a second plane that is perpendicular to the emission axis; and the metal reflector diameter is in the range of approximately one-third of the tunnel junction diameter and the tunnel junction diameter. In an example embodiment, the low reflectivity partial semiconductor Bragg reflector of the composite mirror suppresses emission of higher order modes of the emitted radiation. In an example embodiment, the metal reflector defines an ellipse in the second plane and the metal reflector causes selection of a polarization of the emitted light. In an example embodiment, the metal reflector comprises a first layer comprising titanium and a second layer comprising gold, the second layer having a greater thickness in a dimension corresponding to an emission axis of the VCSEL than the first layer.

In an example embodiment, the output coupling mirror comprises a semiconductor distributed Bragg reflector. In an example embodiment, the output coupling mirror comprises 25 pairs of layers of GaAs and AlGaAs.

In an example embodiment, the VCSEL further comprises a first contact mesa and second contact mesa; an anode contact and a cathode contact, each of the anode contact and the cathode contact in electrical communication with a corresponding one of the second current-spreading layer and the first current-spreading layer, wherein the anode contact is partially disposed on the first contact mesa, the cathode contact is partially disposed on the second contact mesa, and the active region is disposed between the first contact mesa and the second contact mesa.

In an example embodiment, the VCSEL further comprises a lens through which the emitted radiation is emitted. In an example embodiment, the lens is formed from the first surface of the substrate. In an example embodiment, the VCSEL further comprises a lens layer secured to the first surface of the substrate, the lens layer comprising the lens. In an example embodiment, the lens is configured to couple to an optical fiber or waveguide.

In an example embodiment, the VCSEL further comprises an anti-reflective coating disposed on the first surface of the substrate.

According to another aspect, a board-mounted VCSEL is provided. In an example embodiment, the board-mounted VCSEL comprises a circuit board comprising an anode lead and a cathode lead; and a VCSEL. The VCSEL comprises a substrate having a first surface and a second surface; an output coupling mirror disposed on the second surface of the substrate; a high reflectivity mirror; an active cavity material structure disposed between the output coupling mirror and the high reflectivity mirror. The active cavity material structure comprises a first current-spreading layer, a second current-spreading layer, an active region disposed between the first current-spreading layer and the second current-spreading layer, and a tunnel junction overgrown by the second current-spreading layer, wherein the tunnel junction is disposed adjacent the active region. The VCSEL further comprises an anode contact and a cathode contact, each of the anode contact and the cathode contact in electrical communication with a corresponding one of the second current-spreading layer and the first current-spreading layer. The anode contact is secured in electrical communication with the anode lead, the cathode contact is secured in electrical communication with the cathode lead, and the VCSEL is configured to emit radiation outward through the first surface of the substrate and away from the circuit board.

In an example embodiment, the circuit board is a printed circuit board.

According to another aspect, a multi-beam emission device is provided. In an example embodiment, the multi-beam emission device comprises a VCSEL driver array comprising a plurality of VCSEL drivers and corresponding leads; and a monolithic VCSEL array. The monolithic VCSEL array comprises a substrate comprising a first surface and a second surface, and a plurality of emission structures. Each emission structure comprises an output coupling mirror disposed on the second surface of the substrate; a high reflectivity mirror; an active cavity material structure disposed between the output coupling mirror and the high reflectivity mirror. The active cavity material structure comprises a first current-spreading layer, a second current-spreading layer, an active region disposed between the first current-spreading layer and the second current-spreading layer, and a tunnel junction overgrown by the second current-spreading layer, wherein the tunnel junction is disposed adjacent the active region. Each emission structure further comprises an anode contact and a cathode contact, each of the anode contact and the cathode contact in electrical communication with an opposite one of the second current-spreading layer and the first current-spreading layer. The anode contact and the cathode contact are secured in electrical communication with a pair of leads corresponding to a driver of the plurality of drivers. The first surface of the substrate comprises a plurality emission locations. Each of the plurality of emission structures are configured to emit radiation through the first surface at a corresponding one of the plurality of emission locations.

In an example embodiment, a first emission structure of the plurality of emission structures is configured to emit radiation characterized by a first wavelength; a second emission structure of the plurality of emission structures is configured to emit radiation characterized by a second wavelength; and the first wavelength is different from the second wavelength.

BRIEF DESCRIPTION OF THE DRAWING(S)

Having thus described the invention in general terms, reference will now be made to the accompanying drawings, which are not necessarily drawn to scale, and wherein:

Figure 6:
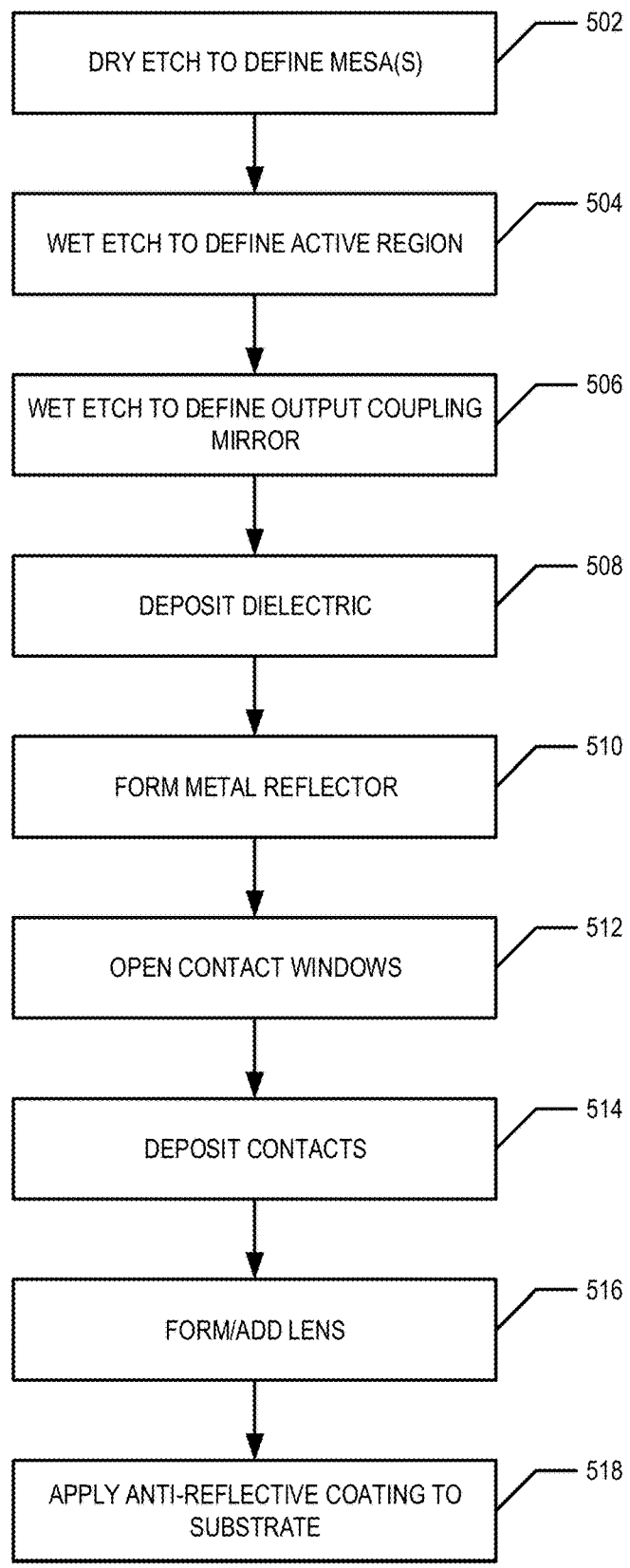
Figure 7:
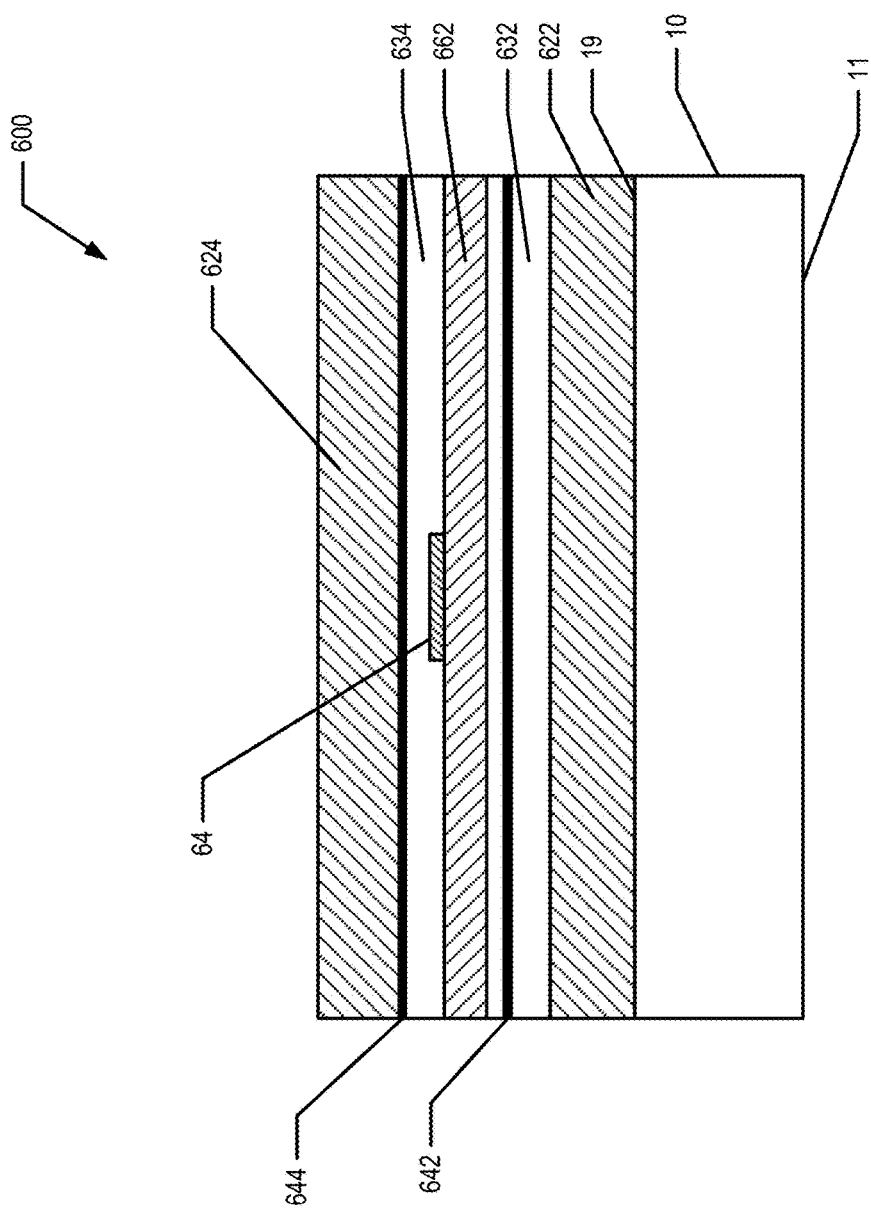
Figure 8:
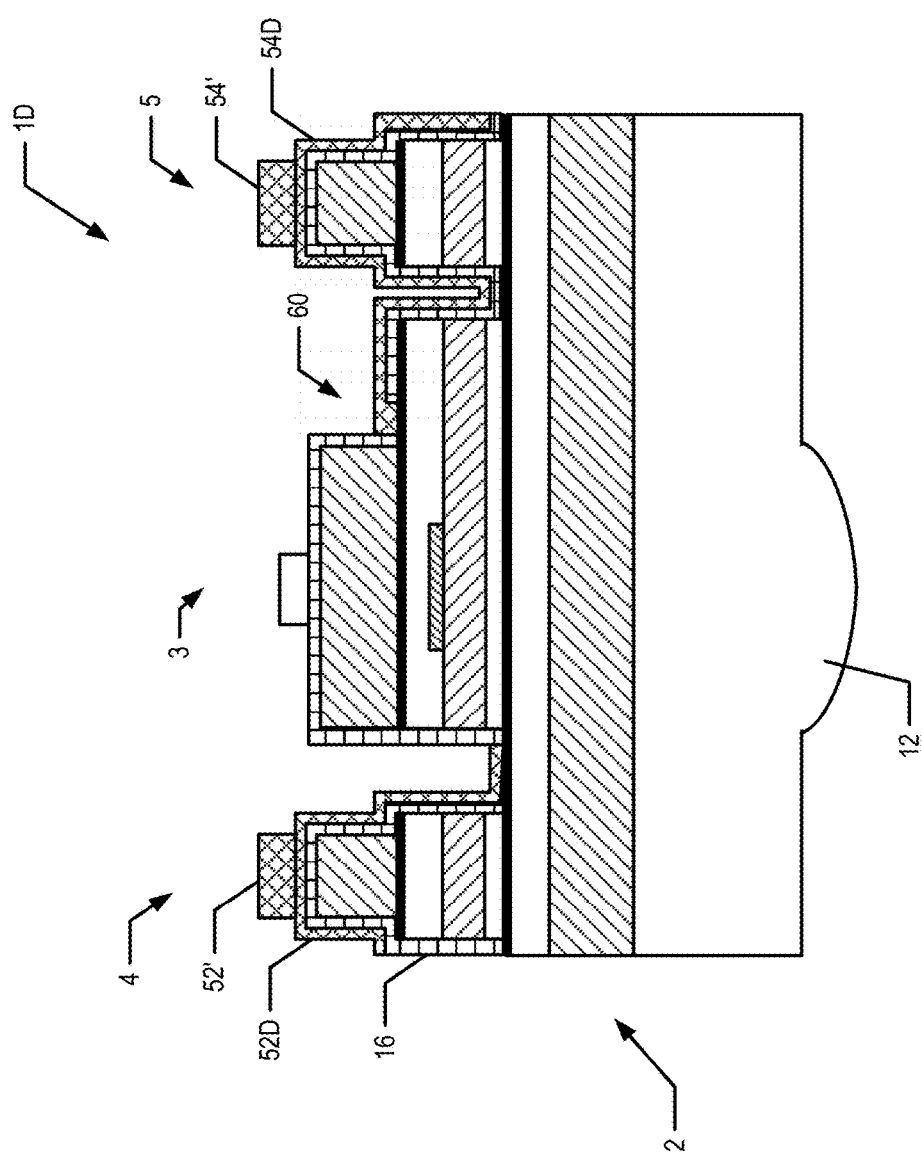

FIG. 6 provides a flowchart illustrating an example method for manufacturing a VCSEL, according to example embodiments;

FIG. 7 provides a schematic cross-section of VCSEL blank, according to an example embodiment;

FIG. 8 illustrates a schematic cross-section of a VCSEL that may be manufactured according to the flowchart of FIG. 6 when starting from the blank of FIG. 7, according to an example embodiment; and FIGS. 9A, 9B, 9C, 9D, and 9E compare an example embodiment of a VCSEL of the present invention to a state of the art "top emitting" VCSEL.

DETAILED DESCRIPTION OF SOME EXAMPLE EMBODIMENTS

The present invention now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout. As used herein, terms such as "top," "bottom," "front," etc. are used for explanatory purposes in the examples provided below to describe the relative position of certain components or portions of components. Accordingly, as an example, the term "top current spreading layer" may be used to describe a current spreading layer; however, the current spreading layer may be on the top or on the bottom, depending on the orientation of the particular item being described. The term "approximately" is used herein to mean within manufacturing and/or engineering standards.

Example VCSEL

Figure 1:
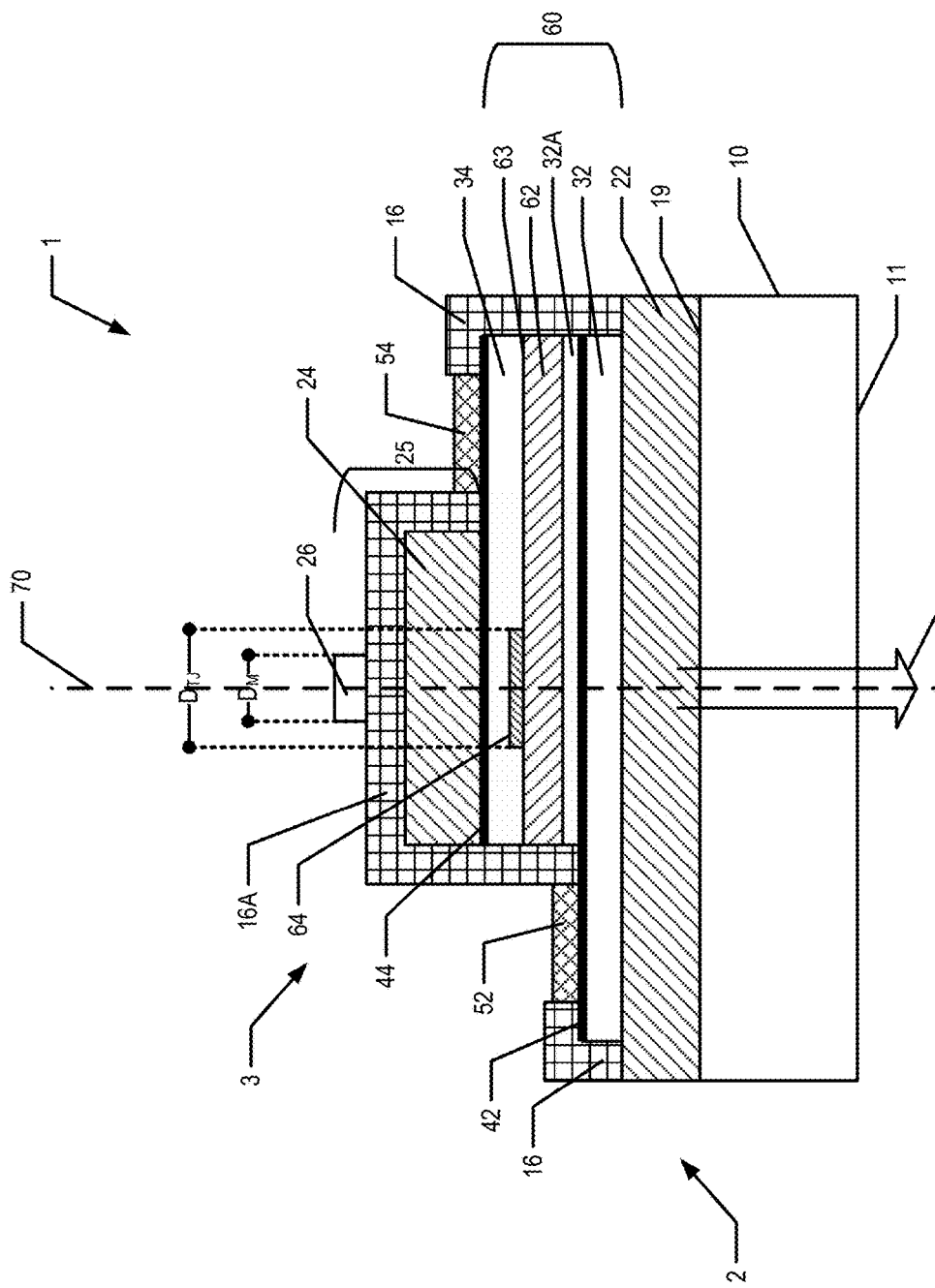
FIG. 1 illustrates a schematic cross-section of a VCSEL, according to an example embodiment.

FIG. 1 illustrates an example embodiment of vertical-cavity surface-emitting laser (VCSEL) 1, according to an example embodiment of the present invention. The VCSEL 1 comprises an emission structure 2 disposed on, secured to, formed on, and/or the like a substrate 10. For example, the emission structure 2 may be disposed on, secured to, formed on, and/or the like a second surface 19 of the substrate 10 and configured such that radiation is emitted by the emission structure through the substrate 10 such that the radiation is emitted by the VCSEL 1 outward through the first surface 11 of the substrate 10. In an example embodiment, the substrate 10 is a gallium arsenide (GaAs) substrate.

In various embodiments, the emission structure 2 comprises an output coupling mirror 22, a high reflectivity mirror 25, and an active cavity material structure 60. In various embodiments, the emission structure 2 may further comprise anode contact 54, cathode contact 52, dielectric material 16, two contact layers 42, 44, and/or the like. In various embodiments, the active cavity material structure 60 comprises a first current-spreading layer 32, a second current-spreading layer 34, an active region 62 disposed between the first current-spreading layer 32 and the second current-spreading layer 34, and a tunnel junction 64 overgrown by the second current spreading layer 34, wherein the tunnel junction 64 is disposed adjacent the active region 62. In an example embodiment, the output coupling mirror comprises a semiconductor distributed Bragg reflector (DBR). In various embodiments, the high reflectivity mirror 25 comprises a composite mirror. In an example embodiment, the composite mirror comprises a partial reflector 24 and a metal reflector 26. In various embodiments, the partial reflector 24 and the metal reflector 26 may be separated by a layer dielectric material 16A. In various embodiments, the size and shape of metal reflector 26 may be used for mode and/or polarization selection such that the VCSEL 1 provides radiation of a selected mode (e.g., the fundamental mode) and a selected polarization. In an example embodiment, the partial reflector 24 may be used for mode selection such that the VCSEL 1 provides radiation of a selected mode (e.g., the fundamental mode).

In various embodiments, laser light 100 is emitted from the VCSEL 1 through the first surface 11 of the substrate 10. The light emitted by the VCSEL 1 defines a light emission axis 70 of the VCSEL 1. Various elements of the example VCSEL 1 will now be described in more detail.

In various embodiments, the emission structure 2 comprises an output coupling mirror 22. In various embodiments, a first surface of the output coupling mirror 22 is adjacent, affixed to, abuts, and/or the like the second surface 19 of the substrate 10. In an example embodiment, a second surface of the output coupling mirror 22 is opposite the first surface of the output coupling mirror in a direction defined by and/or parallel to the light emission axis 70. In various embodiments, at least a portion of a second surface of the output coupling mirror 22 is adjacent, affixed to, abuts, and/or the like the second current-spreading layer 32. In an example embodiment, the output coupling mirror 22 comprises an un-doped semiconductor distributed Bragg reflector (DBR) mirror and/or dielectric reflector stacks. For example, the output coupling mirror 22 may comprise un-doped alternating layers of aluminum gallium arsenide (AlGaAs) and gallium arsenide (GaAs). In an example embodiment, the output coupling mirror 22 has approximately 98% reflectivity from the perspective of active region 62. In an example embodiment, the output coupling mirror 22 comprises 25 pairs of layers of GaAs/AlGaAs. For example, the output coupling mirror 22 may comprise 25 layers of GaAs and 25 layers of AlGaAs wherein the layers are disposed such that the layers alternate between a GaAs layer and an AlGaAs. For example, a pair of layers consists of a GaAs layer and an abutting AlGaAs layer. In an example embodiment, the thickness of each layer is approximately one-fourth $\lambda/n$, where $\lambda$ is emission wavelength and n is the refractive index of semiconductor of that layer.

In various embodiments, the emission structure 2 comprises a high reflectivity mirror 25. In an example embodiment, the high reflectivity mirror 25 is a composite mirror. In an example embodiment, the composite mirror comprises partial reflector 24 and a metal reflector 26. In an example embodiment, the partial reflector 24 and the metal reflector 26 are separated by layer of dielectric material 16A. In various embodiments, a first surface of the partial reflector 24 is adjacent, affixed to, abuts, and/or the like the second contact layer 44. In an example embodiment, a second surface of the partial reflector 24 is opposite the first surface of the partial reflector 24 in a direction defined by and/or parallel to the light emission axis 70. In various embodiments, at least a portion of a second surface of the partial reflector 24 is adjacent, affixed to, abuts, and/or the like a layer of dielectric material 16A. In an example embodiment, the partial reflector 24 comprises an un-doped DBR mirror, dielectric stacks, and/or the like. For example, the partial reflector 24 may comprise un-doped alternating layers of AlGaAs and GaAs. In an example embodiment, the partial reflector 24 has approximately 80% reflectivity from the perspective of active region 62. In an example embodiment, the partial reflector 24 comprises 10 pairs of layers of GaAs/AlGaAs. For example, the partial reflector 24 may comprise 10 layers of GaAs and 10 layers of AlGaAs wherein the layers are disposed such that the layers alternate between a GaAs layer and an AlGaAs. For example, a pair of layers consists of a GaAs layer and an abutting AlGaAs layer. In an example embodiment, the thickness of each layer is approximately one-fourth $\lambda/n$, where h is emission wavelength and n is the refractive index of semiconductor of that layer.

As noted above, the reflectivity of the partial reflector 24 is approximately 80% from the perspective of the active region 62, in various embodiments. In various embodiments, the reflectivity of the high reflectivity mirror 25 is up to approximately 100%. As noted above, the metal reflector 26 is disposed on the second surface of the partial reflector 24 and/or separated from the second surface of the partial reflector 24 by, for example, a layer of dielectric material 16A. In an example embodiment, the metal reflector comprises a first layer comprising and/or consisting of titanium (Ti) and a second layer comprising and/or consisting of gold (Au). In an example embodiment, the second layer has a greater thickness in a direction corresponding and/or parallel to the emission axis 70 than the first layer. In an example embodiment, the first layer consists of Ti and is 5 nm thick in a direction corresponding and/or parallel to the emission axis 70 and the second layer consists of Au and is 100 nm thick in the direction corresponding and/or parallel to the emission axis 70. Because of a very low thickness of the first layer, the first layer (e.g., a Ti adhesion layer) approximately does not induce additional optical absorption.

In a plane perpendicular to the emission axis 70, the metal reflector 26 defines a metal reflector diameter $D_M$. Similarly, in a plane perpendicular to the emission axis 70, the tunnel junction 64 defines a tunnel junction diameter $D_{TJ}$. In various embodiments, the metal reflector diameter $D_M$ is in the range of approximately one-third of the tunnel junction diameter $D_{TJ}$ and the tunnel junction diameter $D_{TJ}$ (e.g. $D_{TJ}/3 \leq D_M \leq D_{TJ}$). In an example embodiment, the metal reflector diameter $D_M$ is 3 nm and the tunnel junction diameter $D_{TJ}$ is 6 nm. In an example embodiment, the metal reflector diameter $D_M$ is selected to as to suppress and/or decrease reflection of higher modes of the radiation 100 emitted from the VCSEL. For example, the metal reflector diameter $D_M$ may be selected to reduce the reflection of higher modes of radiation while still reflecting a significant portion (e.g., approximately 99.9%) of the fundamental mode of the radiation. In an example embodiment, the radiation (e.g., the fundamental mode radiation and/or higher mode radiation) and/or a portion thereof that is leaked by and/or around the metal reflector 26 may be captured and used for power monitoring, in an example embodiment. In an example embodiment, in a plane perpendicular to the emission axis 70, the metal reflector 26 defines a circle. In an example embodiment, in a plane perpendicular to the emission axis 70, the metal reflector 26 defines an ellipse or other non-circular shape. In an example embodiment, the shape defined by the metal reflector 26 in a plane perpendicular to the emission axis 70 is selected so as to select a particular polarization of radiation to be emitted by the VCSEL 1. For example, the shape of the metal reflector 26 in a plane perpendicular to the emission axis 70 may cause a particular polarization of radiation to be reflected more efficiently than other polarizations of the radiation, thereby suppressing the other polarizations and effectively selecting the particular polarization for emission from the VCSEL 1.

In various embodiments, the high reflectivity mirror is a composite mirror comprising a layer of dielectric material 16A sandwiched, at least in part, between the partial reflector 24 and the metal reflector 26. In an example embodiment, the dielectric material 16A may be silicon nitride ($Si_3N_4$). In an example embodiment, the thickness of the layer of dielectric material 16A in a direction corresponding and/or parallel to the emission axis 70 is approximately 150 nm. In various embodiments, the thickness of the layer of dielectric material 16A in a direction corresponding and/or parallel to the emission axis 70 is approximately $0.22\lambda$, where $\lambda$ is the wavelength that characterizes the emission 100. For example, if $\lambda=1310$ nm, the thickness of the layer of dielectric material 16A is approximately 150 nm.

In various embodiments, the emission structure 2 comprises first and second contacts 52, 54. For example, the first contact 52 may be an anode contact and the second contact 54 may be a cathode contact, or vice versa. The first contact 52 is in electrical communication with a first contact layer 42 and the second contact 54 is in electrical communication with a second contact layer 44. In various embodiments, when two elements are in electrical communication with one another, electrical signals, current, and/or the like may pass from one of the elements into the active region and to the other element. In various embodiments, the first and/or second contact layer 42, 44 comprises an indium gallium arsenide phosphide (InGaAsP) layer. In various embodiments, the first and second contact layers 42, 44 are configured to provide electrical signals, current, voltage, and/or the like applied to the first and second contacts 52, 54 to the active cavity material structure 60.

In example embodiments, the active cavity material structure 60 comprises a first current-spreading layer 32, a second current-spreading layer 34, an active region 62 disposed between the first current-spreading layer 32 and the second current-spreading layer 34, and a tunnel junction 64 overgrown by the second current spreading layer 34, wherein the tunnel junction 64 is disposed adjacent and/or abuts the active region 62 (e.g., at the second surface 63 of the active region 62). In various embodiments, the first contact layer 42 is in electrical communication with the first current-spreading layer 32 and the second contact layer 44 is in electrical communication with the second current-spreading layer 34.

In various embodiments, the first and second current-spreading layers 32, 34 comprise n-type indium phosphide (n-InP) layers. In various embodiments, providing the electrical contacting through n-type first and second current-spreading layers 32, 34 allows for the output coupling mirror 22 and the partial reflector 24 to each comprise un-doped DBR mirrors or dielectric reflector stacks, as described elsewhere herein. In an example embodiment, the first current-spreading layer 32 further comprises layer 32A such that the contact layer 42 is partially embedded and/or disposed within the first current-spreading layer 32.

In various embodiments, a tunnel junction 64 is embedded and/or disposed within the second current-spreading layer 34. In an example embodiment, the tunnel junction 64 is a mesa etched in the $p^{++}/n^{++}$ tunnel junction. In an example embodiment, the tunnel junction 64 comprises a heavily doped p++/n++ indium aluminum gallium arsenide tunnel junction. In various embodiments, a reverse biased p-n junction blocks the current around the tunnel junction when a direct voltage is applied to the VCSEL 1 (e.g., via the first and second contacts 52, 54). In various embodiments, the tunnel junction 64 serves a dual role of optical (photon) and electrical (current) confinement. The tunnel junction 64 may, for example, be embedded in an overgrown region which provides both current and photon confinement. In this example, the current is confined by the reverse p-n junction that is formed at the interface between the second current spreading layer 34 and a p-layer comprising a second surface 63 of the active region 62. The optical confinement is defined by the tunnel junction 64 representing an optical aperture for emitting radiation 100 (e.g., laser light) and is determined by the width or diameter of the tunnel junction 64 (e.g., the tunnel junction diameter $D_{TJ}$) in a plane perpendicular to the emission axis 70.

In various embodiments, the active region 62 is sandwiched and/or disposed between the first and second current-spreading layers 32, 34. In various embodiments, the active region 62 is in electrical communication with the first and second current-spreading layers 32, 34. In various embodiments, the active region 62 comprises a plurality of quantum wells, where radiation 100 is generated, between the output coupling mirror 22 and high reflectivity mirror 25. In some various embodiments, the active region 62 may comprise a multi-quantum well (MQW) layer stack comprising a series of quantum wells disposed between a series of barriers, a p-type region (layer) disposed between the second current-spreading layer 34 and the MQW layer stack. For example, a second surface 63 of the active region 62 may comprise a p-type layer. In an example embodiment, the series of quantum wells and barriers may comprise six un-doped compressively strained, indium aluminum gallium arsenide (InAlGaAs) quantum wells and seven tensile strained InAlGaAs barriers.

In various embodiments, the VCSEL 1 may comprise dielectric material 16. For example, the VCSEL 1 may comprise dielectric material 16 configured to electrically isolate the first and second contacts 52, 54, the first and second current-spreading layers 32, 34, and/or the output coupling mirror 22. In an example embodiment, the dielectric material comprises and/or consists of $Si_3N_4$. In various embodiments, the layer thickness of dielectric material 16 may be approximately 150 nm.

In various embodiments, the active cavity material structure 60 forms a mesa 3 with the high reflectivity mirror 25 disposed, positioned, affixed to, and/or the like the top of the mesa 3. In various embodiments, the mesa 3 is formed on top of the underlying structures, such as, for example, the output coupling mirror 22 and the substrate 10. An example manufacturing process of a VCSEL 1 can include reactive ion etching (RIE) and chemical etching through the various layers to cause the formation of the mesa 3, in an example embodiment.

Figure 2:
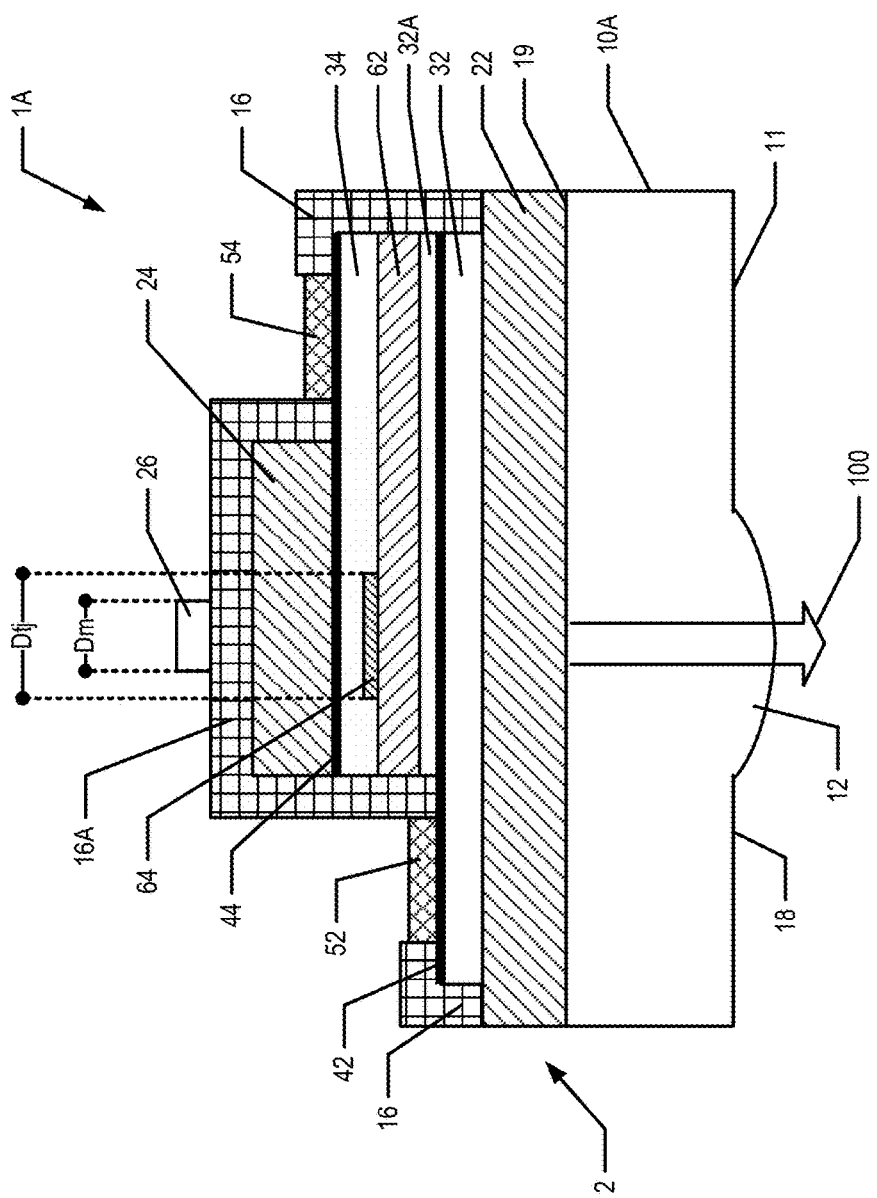
FIG. 2 illustrates a schematic cross-section of a VCSEL, according to another example embodiment.

FIG. 2 illustrates another example embodiment of a VCSEL 1A. The VCSEL 1A is formed on a substrate 10 that is then processed to form a substrate 10A comprising a lens 12. An output coupling mirror 22 is adjacent, affixed to, abuts, and/or the like the second surface 19 of the substrate 10A. A first current-spreading layer 32 may be adjacent, affixed to, and/or abut the output coupling mirror 22. The first current-spreading layer 32 may be in direct electrical communication with a first contact layer 42, which is, in turn, in direct electrical communication with a first contact 52. An active region 60 may be sandwiched, disposed, and/or positioned between the first current-spreading layer 32 and a second current-spreading layer 34. An overgrown tunnel junction 64 may be embedded, disposed, position, and/or grown in the second current-spreading layer 34 such that the tunnel junction 64 is adjacent and/or abuts the active region 62. A high reflectivity mirror 25 may be adjacent, affixed to, and/or abut the second current-spreading layer 34. The VCSEL 1A may further comprise dielectric material 16, 16A.

As shown in FIG. 2, the substrate 10A of VCSEL 1A comprises a lens 12. In an example embodiment, the lens 12 forms at least a portion of the first surface 11 of the substrate 10A. For example, the substrate 10 may be machine worked to form substrate 10A comprising a lens 12. In an example embodiment, the lens 12 may comprise one or more micro lenses. For example, the lens 12 may be formed on the first surface 11 of the substrate 10A using, for example, a dry etching process. For example, the lens 12 may be a monolithic lens formed from the substrate itself. For example, the lens 12 may comprise GaAs. In an example embodiment, the lens axis defined by the lens 12 is aligned, co-linear, and/or parallel to the emission axis 70. For example, the lens 12 may be positioned such that a line parallel to the emission axis 70 connects a center point of the lens 12 and center point of the tunnel junction 64. In an example embodiment, the lens 12 may be configured to collimate the beam of radiation 100 (e.g., laser light) emitted from the VCSEL 1A. In an example embodiment, the lens 12 is configured to aid in coupling the VCSEL 1A, and/or radiation 100 emitted thereby, to an optical fiber (e.g., a single mode fiber or multimode fiber), waveguide, and/or the like. In an example embodiment, an anti-reflective coating 18 is applied to the first surface 11 of the substrate 10A.

Figure 3:
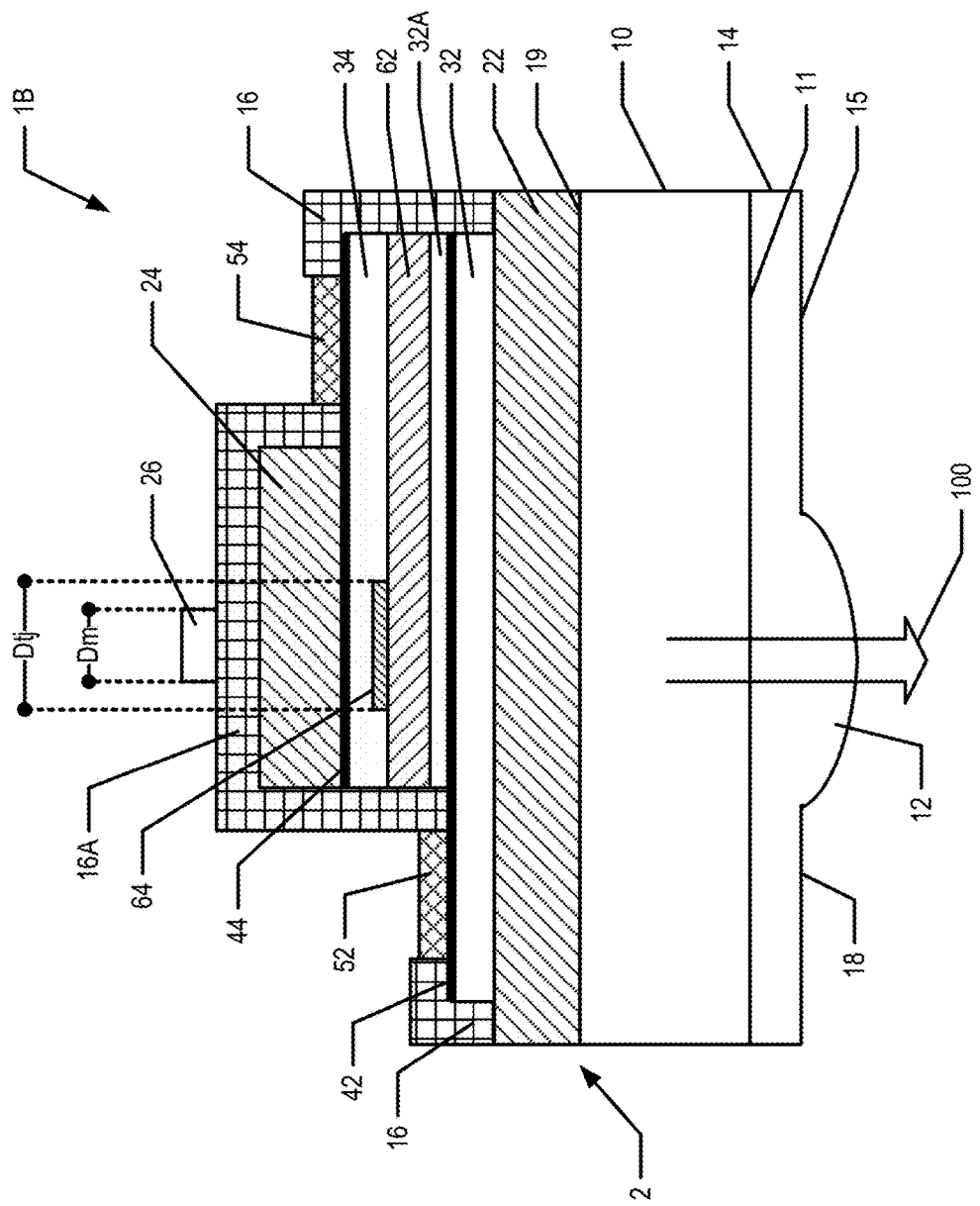
FIG. 3 illustrates a schematic cross-section of a VCSEL, according to yet another example embodiment.

FIG. 3 illustrates another example embodiment of a VCSEL 1B. The VCSEL 1B is formed on a substrate 10. An output coupling mirror 22 is adjacent, affixed to, abuts, and/or the like the second surface 19 of the substrate 10. A first current-spreading layer 32 may be adjacent affixed to, and/or abut the output coupling mirror 22. The first current-spreading layer 32 may be in direct electrical communication with a first contact layer 42, which is, in turn, in direct electrical communication with a first contact 52. An active region 60 may be sandwiched, disposed, and/or positioned between the first current-spreading layer 32 and a second current-spreading layer 34. An overgrown tunnel junction 64 may be embedded, disposed, position, and/or grown in the second current-spreading layer 34 such that the tunnel junction 64 is adjacent and/or abuts the active region 62. A high reflectivity mirror 25 may be adjacent, affixed to, and/or abut the second current-spreading layer 34. The VCSEL 1B may further comprise dielectric material 16, 16A.

As shown in FIG. 3, a preformed lens layer 14 may be secured, affixed, adhered, and/or the like to the first surface 11 of the substrate 10. The preformed lens layer 14 may comprise a lens 12. In an example embodiment, the preformed lens layer 14 may comprise plastic, glass, and/or other appropriate material. The preformed lens layer 14 may be secured, affixed, adhered and/or the like to the first surface 11 of the substrate 10 such that the lens axis defined by the lens 12 is aligned, co-linear, and/or parallel to the emission axis 70. For example, the lens 12 may be positioned such that a line parallel to the emission axis 70 connects a center point of the lens 12 and center point of the tunnel junction 64. In an example embodiment, the lens 12 may be configured to collimate the beam of radiation 100 (e.g., laser light) emitted from the VCSEL 1A. In an example embodiment, the lens 12 is configured to aid in coupling the VCSEL 1A, and/or radiation 100 emitted thereby, to an optical fiber (e.g., a single mode fiber or multimode fiber), waveguide, and/or the like. In an example embodiment, an anti-reflective coating 18 is applied to the first surface 15 of the preformed lens 14.

Example Board-Mounted VCSEL

Figure 4:
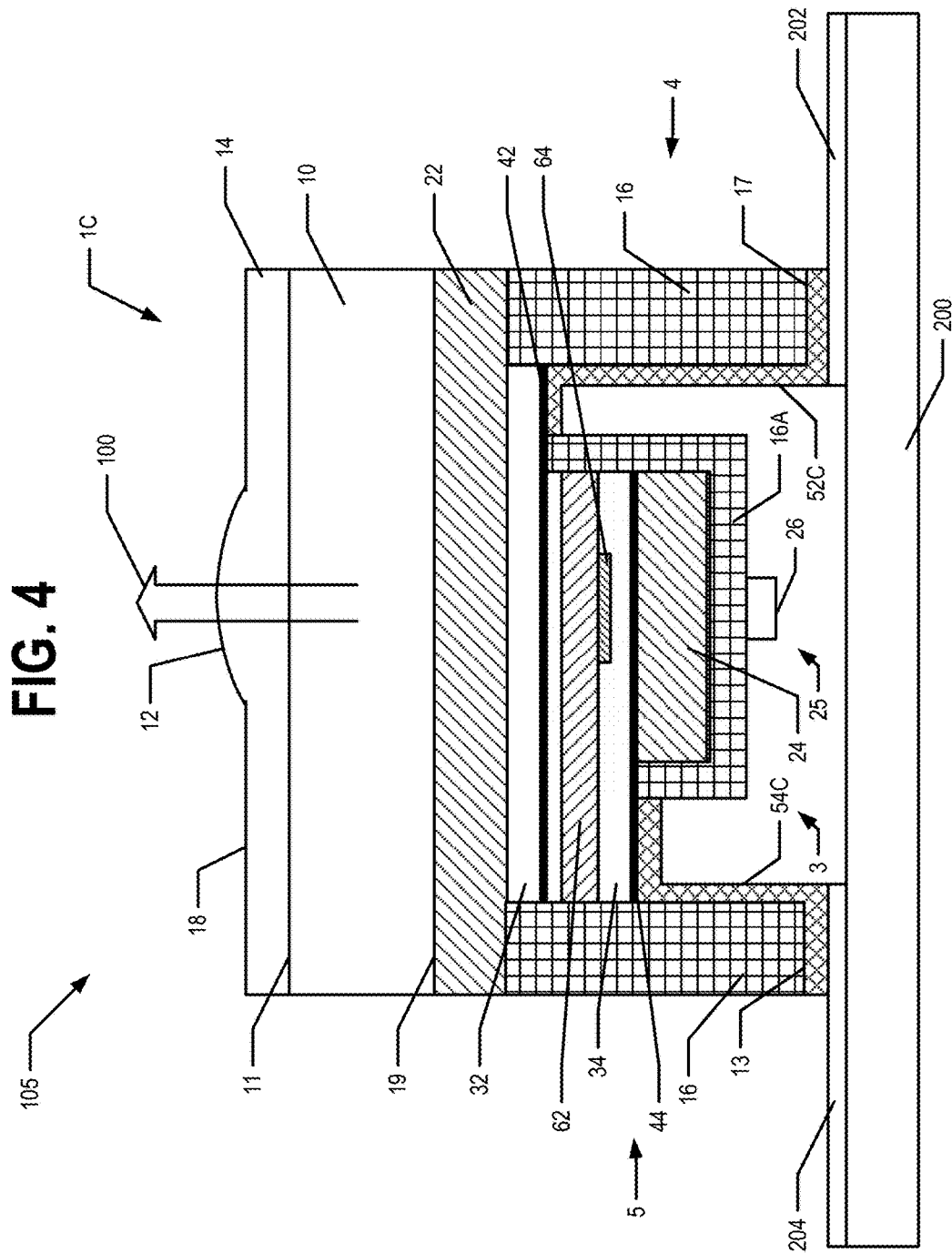
FIG. 4 illustrates a schematic cross-section of a board-mounted VCSEL, according to an example embodiment.

FIG. 4 illustrates an example embodiment of a board-mounted VCSEL 105. In an example embodiment, the board-mounted VCSEL 105 comprises a VCSEL 1C mounted to a circuit board 200. In an example embodiment, the VCSEL 1C is flip chip mounted to the circuit board 200. For example, the VCSEL 1C is mounted to the circuit board 200 such that the substrate 10 is not proximate and/or not adjacent to the circuit board 200. The VCSEL 1C is an example of a board mounted VCSEL. In an example embodiment, the circuit board 200 is a printed circuit board. The circuit board 200 comprises a first lead 202 and a second lead 204. The first contact 52C is mechanically secured to the first lead 202 such that the first contact 52C is in electrical communication with the first lead 202. The second contact 54C is mechanically secured to the second lead 204 such that the second contact 54C is in electrical communication with the second lead 204. In an example embodiment, the first lead 202 is the anode lead, the first contact 52C is the anode contact, the second lead 204 is the cathode lead, and the second contact 54C is the cathode contact. In another example embodiment, the first lead 202 is the cathode lead, the first contact 52C is the cathode contact, the second lead 204 is the anode lead, and the second contact 54C is the anode contact.

The first contact 52C is at least partially disposed on a first contact mesa 4 and the second contact 54C is at least partially disposed on a second contact mesa 5. The first and second contact mesas 4, 5 may comprise dielectric material 16 and/or other layers. The mesa structure 3 is disposed between the first contact mesa 4 and the second contact mesa 5. In an example embodiment, the first contact 52C is disposed at least partially along a second surface 17 of the first contact mesa 4, down the side of the first contact mesa 4, and is in electrical communication with the first contact layer 42. Similarly, the second contact 54C is disposed at least partially along a second surface 13 of the second contact mesa 5, down the side of the second contact mesa 5, and is in electrical communication with the second contact layer 44. The mesa structure 3 comprises a high reflectivity mirror 25; a second current-spreading layer 34 in electrical communication with the second contact layer 44 and having a tunnel junction 64 embedded, disposed, and/or grown therein, an active region 60; a first current-spreading layer 32 in electrical communication with the first contact layer 44; and an output coupling mirror 22, as described in more detail elsewhere herein.

The VCSEL 1C is formed on a substrate 10 and configured such that radiation 100 emitted by the VCSEL 1C is emitted through the substrate 10 (e.g., via the first surface 11). The VCSEL 1C further comprises a preformed lens layer 14 comprising a lens 12. As should be understood from the discussion above, a board mounted VCSEL may comprise a monolithic lens 12 formed from the substrate 10, in an example embodiment. Thus, radiation 100 (e.g., laser light) emitted by the VCSEL 1C may be emitted through the lens 12 along the emission axis 70. The lens 12 may be coupled to an optical fiber, waveguide, and/or the like such that the radiation 100 emitted through the lens 12 is then coupled to the optical fiber, waveguide, and/or the like for transmission, processing, and/or the like.

Example Multi-Beam Emission Device

Figure 5:
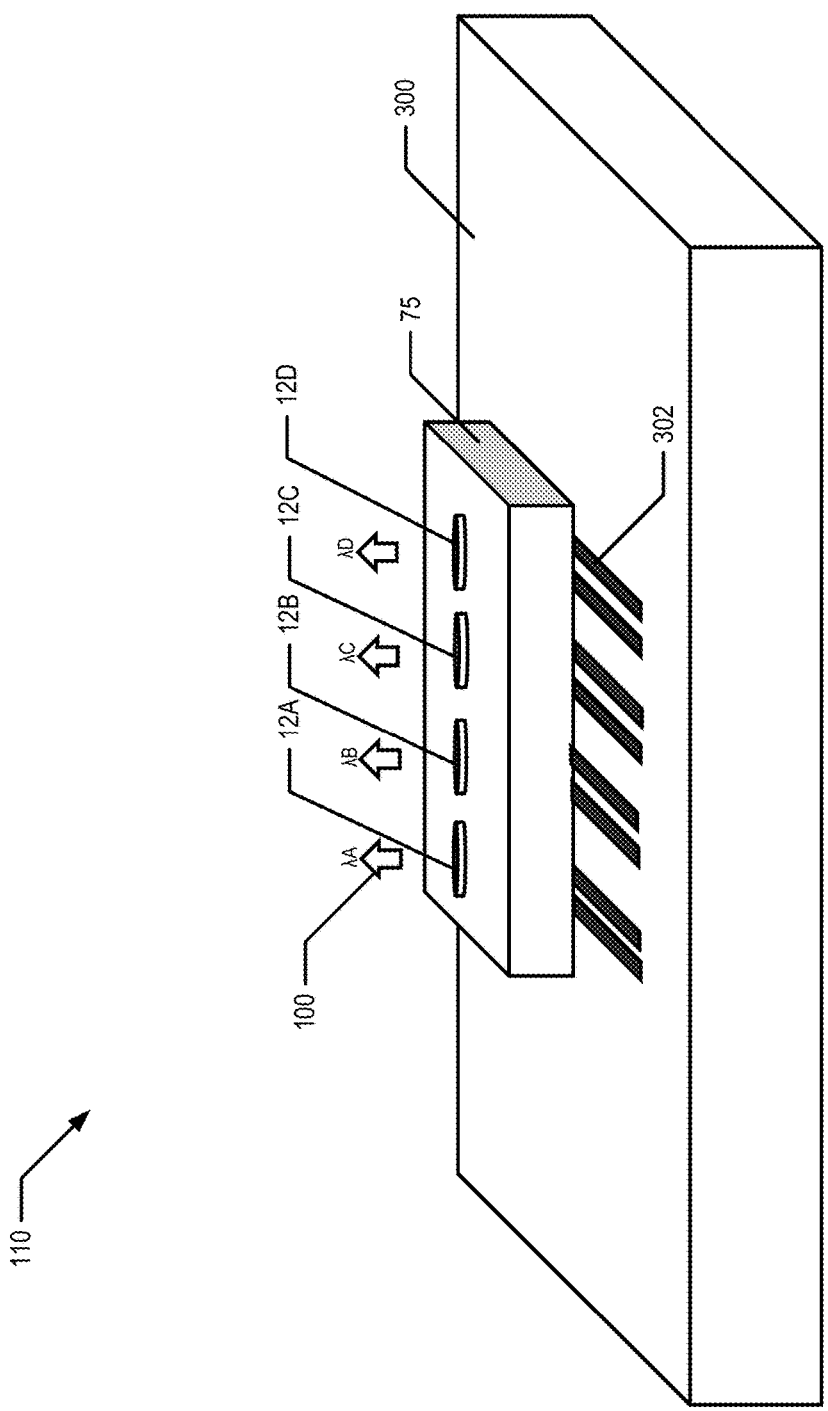
FIG. 5 illustrates a schematic perspective view of a multi-beam emission device, according to an example embodiment.

In various embodiments, a multi-beam emission device 110 is provided. An example embodiment of a multi-beam emission device 110 is illustrated in FIG. 5. For example, one or more monolithic VCSEL arrays 75 may be operatively secured, mounted to, affixed to, and/or the like the leads 302 of a driver array 300. In an example embodiment, a monolithic VCSEL array 75 comprises a plurality of emission structures 2 formed on single substrate 10. For example, the monolithic VCSEL array 75 may be mounted to the driver array 300 such that the contacts 52, 54 of one or more of the emission structures 2 is mounted to the corresponding leads 302 of the driver array 300. In an example embodiment, the driver array 300 comprises a plurality of laser drivers each configured to drive, operate, and/or the like an emission structure of a VCSEL.

In an example embodiment, each emission structure 2 of the monolithic VCSEL array 75 is configured, engineered, and/or the like to emit radiation 100 of a characteristic wavelength. In various embodiments, each emission structure 2 is configured to emit radiation 100 at an emission location on the first surface 11 of the substrate 10. In an example embodiment, the characteristic wavelengths of each emission structure may be different. For example, the monolithic VCSEL array 75 may comprise a first emission structure of the plurality of emission structures is configured to emit radiation characterized by a first wavelength; a second emission structure of the plurality of emission structures is configured to emit radiation characterized by a second wavelength; and the first wavelength is different from the second wavelength. For example, in the illustrated embodiment, the monolithic VCSEL array 75 comprises four emission structures 2. A first emission structure 2 emits radiation 100 characterized by wavelength $\lambda_A$, a second emission structure 2 emits radiation 100 characterized by wavelength $\lambda_B$, a third emission structure 2 emits radiation 100 characterized by wavelength $\lambda_C$, and a fourth emission structure 2 emits radiation 100 characterized by wavelength $\lambda_D$. In an example embodiment, $\lambda_A$, $\lambda_B$, $\lambda_C$, and $\lambda_D$ are mutually unique wavelengths. In an example embodiment, $\lambda_A$, $\lambda_B$, $\lambda_C$, and $\lambda_D$ are in the 1310 nm band and have a spacing of 5 nm. For example, in an example embodiment, $\lambda_B=\lambda_A+5$ nm, $\lambda_C=\lambda_B+5$ nm, and $\lambda_D=\lambda_C+5$ nm. As should be understood, various monolithic VCSEL arrays 75 may comprise more or less than four emission structures 2, as appropriate for the intended application.

Each emission structure 2 corresponds with a lens 12 (e.g., 12A, 12B, 12C, 12D) such that radiation 100 emitted by a first emission structure 2 is emitted through the corresponding lens. The lenses 12 may be configured to couple each of the emission structures 2 to an optical fiber, waveguide, and/or the like, such that radiation (e.g., laser light) emitted by an emission structure is coupled to the corresponding optical fiber, waveguide, and/or the like. For example, each lens 12 (e.g., 12A, 12B, 12C, 12D) may be disposed, positioned, and/or the like at an emission location corresponding to one of the emission structures 2 of the monolithic VCSEL array 75.

Example Process for Manufacturing a VCSEL

FIG. 6 provides a flowchart illustrating an example process for manufacturing a VCSEL 1. Starting at block 502, a VCSEL blank comprising a plurality of layers may be dry-etched to define one or more mesas (e.g., 3, 4, and/or 5). FIG. 7 illustrates an example VCSEL blank 600. The VCSEL blank 600 is formed on the second surface 19 of the substrate 10. The VCSEL blank 600 further comprises an output coupling mirror layer 622. In an example embodiment, the output coupling mirror layer 622 comprises a plurality of un-doped alternating layers of AlGaAs and GaAs for forming a DBR mirror. In an example embodiment, the output coupling mirror 22 is formed from at least a portion of the output coupling mirror layer 622. The VCSEL blank 600 further comprises a first conductive layer 632. The first current-spreading layer 32 may be formed from at least a portion of the first conductive layer 632. The VCSEL blank 600 further comprises a second conductive layer 642. The first contact layer 42 may be formed from at least a portion of the second conductive layer 642. The VCSEL blank 600 may further comprise an active layer 662 from which the active region 62 may be formed. The VCSEL blank 600 may further comprise a third conductive layer 634 having a tunnel junction 64 embedded, disposed, and/or grown therein. In an example embodiment, a second current-spreading layer 34 is formed from at least a portion of the third conductive layer 634. The VCSEL blank 600 may further comprise a fourth conductive layer 644 from which the second contact layer 44 may be formed. The VCSEL blank 600 further comprises a partial reflector layer 624. In an example embodiment, the partial reflector layer 624 comprises a plurality of un-doped alternating layers of AlGaAs and GaAs for forming a DBR mirror. In an example embodiment, the partial reflector 24 is formed from at least a portion of the partial reflector layer 624.

The VCSEL blank 600 may be dry etched to form and/or define one or more mesas (e.g., contact mesas 4, 5, mesa structure 3). In an example embodiment, the VCSEL blank 600 is dry etched in Ar—$SiCl_4$ plasma. In an example embodiment, the VCSEL 600 is dry etched using a photoresist or dielectric mask. In an example embodiment, the center of the masked region is aligned with the center of the tunnel junction 64. In an example embodiment, the dry etching is used to define the partial reflector 24. In an example embodiment, the dry-etching is ceased when the fourth conductive layer 644 is exposed.

Continuing with FIG. 6, at block 504 wet etching is used to define and/or form the active region 62. For example, in an example embodiment, the wet etching is done by selective chemical etching in H3PO4-H2O2-H2O solutions until reaching the second conductive layer 642. At block 506, wet etching is used to define and/or form the output coupling mirror 22. For example the first and second conductive layers 642, 632 may be etched (e.g., by selective chemical etching in H3PO4-H2O2-H2O solutions) until the output coupling mirror layer 622 is reached.

At block 508, dielectric may be deposited. For example, chemical vapor deposition may be used to deposit the dielectric material 16, 16A. In an example embodiment, the dielectric material 16, 16A is $Si_3N_4$. The dielectric material 16, 16A electrically and chemically passivates all of the interfaces that were exposed during previous processing steps. The dielectric material 16, 16A also serves as a dielectric for contact window definition.

At block 510, the metal reflector 26 is formed by depositing metal on the dielectric material 16A. In an example embodiment, the metal reflector comprises a first layer comprising Ti and a second layer comprising Au, such that the first layer acts as an adhesion layer between the dielectric material 16A and the second layer. In an example embodiment, the metal reflector 26 is formed by depositing 5 nm of Ti and 100 nm of Au on the dielectric material 16A of the mesa structure 3.

At block 512, the contact windows are opened. For example, a first contact window and a second contact window may be opened in the dielectric material 16 such that a contact may be deposited in each contact window such that the contact will be in electrical communication with the first and second contact layers 42, 44 respectively. At step 514, the first contact 52 is deposited and/or formed in the first contact window and such that the first contact 52 is in direct electrical communication with the first contact layer 42 and the second contact 54 is deposited and/or formed in the second contact window and such that the second contact 54 is in direct electrical communication with the second contact layer 44.

At block 516, the substrate 10 may be machine worked, dry-etched, and/or the like to form a lens 12 thereon. In another example embodiment, a pre-formed lens layer 14 may be affixed to the first surface 11 of the substrate 10. The pre-formed lens layer 14 may comprise a lens 12. At block 518, an anti-reflective coating 18 may be applied to the first surface 11 of the substrate 10, for example if a monolithic lens 12 is used. In another example embodiment, an anti-reflective coating 18 may be applied (or may have been previously applied) to the first surface 15 of the pre-formed lens layer 14.

FIG. 8 illustrates an example embodiment of a VCSEL 1D that may be manufactured according to the example manufacturing method described herein when starting from a blank 600. For example, the VCSEL 1D comprises an emission structure 2 on a substrate 10. The emission structure comprises contact mesas 4, 5 and mesa structure 3. The mesa structure 3 comprises the active cavity material structure 60. The first contact mesa 4 comprises a first contact 52D and a first contact plate 52'. The second contact mesa 5 comprises a second contact 54D and a second contact plate 54'. The first and second contact plates 52', 54' may be electroplated onto the first and second contacts 52D, 54D, in an example embodiment. In an example embodiment, the first and second contacts 52D, 54D and first and second contact plates 52', 54' may be made of metal that was, for example, deposited at step 514, and/or the like.

As should be understood, once a VCSEL 1, 1A, 1B, 1C, 1D has been formed, manufactured, and/or the like, the VCSEL may be secured, affixed, mounted to a circuit board 200. For example, a VCSEL 1, 1A, 1B, 1C may be secured, affixed, mounted to a circuit board 200 such that the first contact 52, 52C is mechanically secured to a first lead 202 such that the first contact 52, 52C is in electrical communication with the first lead 202. For example, a VCSEL 1, 1A, 1B, 1C may be secured, affixed, mounted to a circuit board 200 such that the second contact 54, 54C is mechanically secured to a second lead 204 such that the second contact 54, 54C is in electrical communication with the second lead 204. Mounting a VCSEL 1, 1A, 1B, 1C to a circuit board 200 may therefore manufacture, generate, form, and/or the like a board-mounted VCSEL 105.

Various embodiments provide a multi-beam emission device 110. In an example embodiment, a plurality of emission structures 2 may be formed on a single substrate 10 to generate, form, manufacture, and/or the like a monolithic VCSEL array 75. The monolithic VCSEL array 75 may be mounted to a driver array 300 via the corresponding leads 302 and contacts 52, 54 to generate, form, manufacture, and/or the like a multi-beam emission device 110.

FIG. 9A illustrates a simulation of a state of the art "top emitting" VCSEL and FIG. 9B illustrates a corresponding simulation of an example embodiment of a VCSEL of the present invention, which is termed a "bottom emitting" VCSEL due to the emission of the radiation 100 through the substrate 10. FIG. 9C shows a comparison of the area of various features of the "top emitting" VCSEL shown in FIG. 9A and the example embodiment "bottom emitting" VCSEL shown in FIG. 9B. As can be seen from FIG. 9C, the active region area A may be reduced by a factor of 2 for the example embodiment "bottom emitting" VCSEL compared to the state of the art "top emitting" VCSEL. The reduction in the active region area A causes the capacitance of the example embodiment "bottom emitting" VCSEL to also be reduced by a factor of two. Reduction of the capacitance due to the reduction in the active region area A also reduces parasitic limitation of the bandwidth by increasing the parasitic cutoff frequency $f_p$ according to the formula $f_p=$ $$f_p = \frac{1}{2\pi RC},$$

wherein R is the resistance of the VCSEL and the C is the capacitance of the VCSEL. As shown by FIG. 9C, the p-contact area (Pc) (e.g., the surface area of the contact layer 54), the N-contact area (Nc) (e.g., the surface area of the contact layer 52), and the area of the surface area of the first current spreading layer 32 (T), are also reduced with comparison to the "top emitting" VCSEL shown in FIG. 9A.

FIG. 9D summarizes features of the state of the art "top emitting" VCSEL shown in FIG. 9A. In particular, the "top emitting" VCSEL shown in FIG. 9A comprises an output coupling mirror having 21 pairs of DBR layers (Nt), having a reflectivity of 90% (xt), and having an output coupling through the top (Oct) of 82%. Additionally, the "top emitting" VCSEL shown in FIG. 9A comprises a mirror having 30 pairs of DBR layers (Nb), having a reflectivity of 95% (xb), and having an output coupling through the bottom (OCb) of 18%. The state of the art "top emitting" VCSEL illustrated in FIG. 9A has a threshold gain (THG) of 660 cm$^{-1}$. FIG. 9E provides a table showing the THG simulation results of an example embodiment "bottom emitting" VCSEL having a partial reflector 24 comprising 10 pairs of DBR layers based on the number of pairs of DBR layers (Nb) of the output coupling mirror 22.

CONCLUSION

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A vertical-cavity surface-emitting laser (VCSEL) comprising:
    a substrate having a first surface and a second surface;
    an output coupling mirror disposed on the second surface of the substrate;
    a high reflectivity mirror; and
    an active cavity material structure disposed between the output coupling mirror and the high reflectivity mirror, the active cavity material structure comprising:
        a first current-spreading layer,
        a second current-spreading layer,
        an active region disposed between the first current-spreading layer and the second current-spreading layer, and
        a tunnel junction overgrown by the second current spreading layer, wherein the tunnel junction is disposed adjacent the active region,
    wherein the VCSEL is configured to emit radiation outward through the first surface of the substrate.

2. The VCSEL of claim 1, wherein the high reflectivity mirror is a composite mirror comprising a partial semiconductor distributed Bragg reflector mirror and a metal reflector.

3. The VCSEL of claim 2, wherein:
    the VCSEL defines an emission axis;
    the tunnel junction defines a tunnel junction diameter in a first plane that is perpendicular to the emission axis;
    the metal reflector defines a metal reflector diameter in a second plane that is perpendicular to the emission axis; and
    the metal reflector diameter is in the range of approximately one-third of the tunnel junction diameter and the tunnel junction diameter.

4. The VCSEL of claim 3, wherein the metal reflector defines an ellipse in the second plane and the metal reflector causes selection of a polarization of the emitted radiation.

5. The VCSEL of claim 3, wherein the partial semiconductor distributed Bragg reflector (DBR) around the metal reflector suppresses emission of higher order modes of the emitted radiation.

6. The VCSEL of claim 2, wherein the partial distributed Bragg reflector comprises ten pairs of layers of GaAs and AlGaAs.

7. The VCSEL of claim 2, wherein the metal reflector comprises a first layer comprising titanium and a second layer comprising gold, the second layer having a greater thickness in a dimension corresponding to an emission axis of the VCSEL than the first layer.

8. The VCSEL of claim 1, wherein the output coupling mirror comprises a semiconductor distributed Bragg reflector.

9. The VCSEL of claim 8, wherein the output coupling mirror comprises 25 pairs of layers of GaAs and AlGaAs.

10. The VCSEL of claim 1, further comprising a first contact mesa and second contact mesa;
    an anode contact and a cathode contact, each of the anode contact and the cathode contact in electrical communication with a corresponding one of the second current-spreading layer and the first current-spreading layer,
    wherein:
        the anode contact is partially disposed on the first contact mesa,
        the cathode contact is partially disposed on the second contact mesa, and
        the active region is disposed between the first contact mesa and the second contact mesa.

11. The VCSEL of claim 1, further comprising a lens through which the emitted radiation is emitted.

12. The VCSEL of claim 11 wherein the lens is formed from the first surface of the substrate.

13. The VCSEL of claim 11, further comprising a lens layer secured to the first surface of the substrate, the lens layer comprising the lens.

14. The VCSEL of claim 11, wherein the lens is configured to couple to an optical fiber or waveguide.

15. The VCSEL of claim 1, further comprising an antireflective coating disposed on the first surface of the substrate.

16. A board mounted VCSEL comprising:
    a circuit board comprising an anode lead and a cathode lead;
    a VCSEL comprising:
        a substrate having a first surface and a second surface;
        an output coupling mirror disposed on the second surface of the substrate;
        a high reflectivity mirror;
        an active cavity material structure disposed between the output coupling mirror and the high reflectivity mirror, the active cavity material structure comprising:
            a first current-spreading layer,
            a second current-spreading layer,
            an active region disposed between the first current-spreading layer and the second current-spreading layer, and
            a tunnel junction overgrown by the second current-spreading layer,
        wherein the tunnel junction is disposed adjacent the active region; and
        an anode contact and a cathode contact, each of the anode contact and the cathode contact in electrical communication with an opposite one of the second current-spreading layer and the first current-spreading layer,
    wherein:
        the anode contact is secured in electrical communication with the anode lead,
        the cathode contact is secured in electrical communication with the cathode lead,
        the VCSEL is configured to emit radiation outward through the first surface of the substrate and away from the circuit board.

17. The board mounted VCSEL of claim 16, wherein the circuit board is a printed circuit board.

18. A multi-beam emission device, comprising:
a VCSEL driver array comprising a plurality of VCSEL drivers and corresponding leads;
a plurality of VCSELs comprising:
  a substrate comprising a first surface and a second surface,
  a plurality of emission structures, each emission structure comprising:
    an output coupling mirror disposed on the second surface of the substrate;
    a high reflectivity mirror;
    an active cavity material structure disposed between the output coupling mirror and the high reflectivity mirror, the active cavity material structure comprising:
      a first current-spreading layer,
      a second current-spreading layer,
      an active region disposed between the first current-spreading layer and the second current-spreading layer, and
      a tunnel junction overgrown by the second current-spreading layer,
    wherein the tunnel junction is disposed adjacent the active region; and
    an anode contact and a cathode contact, each of the anode contact and the cathode contact in electrical communication with an opposite one of the second current-spreading layer and the first current-spreading layer,
  wherein:
    the anode contact and the cathode contact are secured in electrical communication with a pair of leads corresponding to a driver of the plurality of drivers,
    the first surface comprises a plurality emission locations, each of the plurality of emission structures configured to emit radiation through the first surface at a corresponding one of the plurality of emission locations.

19. The multi-beam emission device of claim 18, wherein:
a first emission structure of the plurality of emission structures is configured to emit radiation characterized by a first wavelength;
a second emission structure of the plurality of emission structures is configured to emit radiation characterized by a second wavelength; and
the first wavelength is different from the second wavelength.

* * * * *